(12) United States Patent
Wang et al.

(10) Patent No.: US 11,837,617 B2
(45) Date of Patent: Dec. 5, 2023

(54) UNDER-DISPLAY CAMERA SYSTEM AND OPERATING METHOD THEREOF

(71) Applicant: VisEra Technologies Company Ltd., Hsin-Chu (TW)

(72) Inventors: Chun-Yuan Wang, Hsin-Chu (TW); An-Li Kuo, Hsin-Chu (TW); Shin-Hong Kuo, Hsin-Chu (TW); Zong-Ru Tu, Hsin-Chu (TW); Yu-Chi Chang, Hsin-Chu (TW); Han-Lin Wu, Hsin-Chu (TW); Hung-Jen Tsai, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 45 days.

(21) Appl. No.: 17/731,158

(22) Filed: Apr. 27, 2022

(65) Prior Publication Data

US 2023/0352503 A1 Nov. 2, 2023

(51) Int. Cl.
*H01L 27/146* (2006.01)
*G06T 7/13* (2017.01)
*H04N 25/76* (2023.01)

(52) U.S. Cl.
CPC .......... *H01L 27/14621* (2013.01); *G06T 7/13* (2017.01); *H01L 27/14645* (2013.01); *H04N 25/76* (2023.01)

(58) Field of Classification Search
CPC ........ H04N 25/76; H04N 25/10; H04N 25/11; H04N 25/13; H04N 25/134; H04N 25/135; G06T 7/13; H01L 27/14645; H01L 27/14621
See application file for complete search history.

(56) References Cited

U.S. PATENT DOCUMENTS

| | | | |
|---|---|---|---|
| 2016/0219221 A1* | 7/2016 | Yachi | H04N 23/54 |
| 2023/0199325 A1* | 6/2023 | Kuo | G06T 7/557 |
| | | | 348/222.1 |
| 2023/0238416 A1* | 7/2023 | Noudo | H01L 27/14678 |
| | | | 257/291 |

* cited by examiner

*Primary Examiner* — Kelly L Jerabek
(74) *Attorney, Agent, or Firm* — LIU & LIU

(57) ABSTRACT

An operating method of an under-display camera system includes: providing a raw data by a pixel array; generating, by a plurality of color filters respectively disposed on a plurality of first photodiodes of the pixel array, a color information in accordance with the raw data; generating, by a plurality of first narrowband filters respectively disposed on a plurality of second photodiodes of the pixel array, a first narrowband information in accordance with the raw data, wherein a spectrum linewidth of the plurality of first narrowband filters is in a range from 5 nm to 70 nm; reconstructing an edge information from the first narrowband information based on one of a plurality of diffraction patterns provided by a database unit of a point spread function; and obtaining an image by combining the edge information with the color information.

20 Claims, 20 Drawing Sheets

400k

400l

US 11,837,617 B2

UNDER-DISPLAY CAMERA SYSTEM AND OPERATING METHOD THEREOF

BACKGROUND

Field of Invention

The present disclosure relates to an under-display camera system and an operating method of the under-display camera system.

Description of Related Art

In general, an under-display camera system usually has a display and an image sensor, and the display is located above the image sensor. An image generated by the imager sensor has diffraction problems when the light passes through the display. The diffraction problems strongly blur the image. Recently, deep neural networks in combination with point spread function (PSF) are used to restore blurred images caused by the diffraction. The point spread function is defined by the coherent light (such as narrowband light). However, the natural light is incoherent. Therefore, the specific information of the point spread function may be lost when all wavelengths of the incoherent light are summed. This lost information makes the process of restoring an image become harder and eventually leads to a worse resolution in the under-display camera system. Therefore, finding out the lost information may improve the performance of the under-display camera system to restore a better image.

SUMMARY

The coherent light (such as narrowband light) may remain the diffraction information. Adding narrowband filters in an image sensor may provide a new function to detect the narrowband information that is lost in conventional image sensors. The narrowband information is transmitted to a model unit (such as deep neural network) to reconstruct the edge information of an image. A reconstructed edge of the image is transmitted to another model unit (such as deep neural network) to combine with the color information derived from color filters to restore an image.

An aspect of the present disclosure is related to an under-display camera system.

According to an embodiment of the present disclosure, an under-display camera system includes a pixel array, a database unit of a point spread function, a first model unit and a second model unit. The pixel array is configured to provide a raw data. The pixel array includes a plurality of color filters and a plurality of first narrowband filters. The plurality of the color filters are disposed on a plurality of first photodiodes, respectively, and configured to generate a color information in accordance with the raw data. The plurality of first narrowband filters are disposed on a plurality of second photodiodes, respectively, and configured to generate a first narrowband information in accordance with the raw data. A first spectrum linewidth of the plurality of the first narrowband filters is in a range from 5 nm to 70 nm. The database unit of the point spread function is configured to store a plurality of diffraction patterns. The first model unit receives the first narrowband information from the pixel array and is electrically connected to the database unit of the point spread function. The first model unit is configured to reconstruct an edge information from the first narrowband information based on one of the plurality of the diffraction patterns provided by the database unit of the point spread function. The second model unit is electrically connected to the first model unit and the pixel array. The second model unit is configured to obtain an image by combining the edge information with the color information.

In one embodiment of the present disclosure, the plurality of the first narrowband filters correspond to a first single wavelength, and the first single wavelength is in a range from 400 nm to 1000 nm.

In one embodiment of the present disclosure, a spectrum linewidth of the plurality of the color filters is in a range from 150 nm to 200 nm.

In one embodiment of the present disclosure, an area ratio of the plurality of the first narrowband filters in the pixel array is in a range from 6.25% to 25%.

In one embodiment of the present disclosure, adjacent two of the plurality of the first narrowband filters are merged.

In one embodiment of the present disclosure, each of the plurality of the first narrowband filters comprises a first portion and a second portion disposed on the first portion.

In one embodiment of the present disclosure, the first portion corresponds to a first spectrum same as one of the plurality of the color filters, and the second portion corresponds to a second spectrum different from the first spectrum.

In one embodiment of the present disclosure, the plurality of the first narrowband filters are surrounded by the plurality of the color filters.

In one embodiment of the present disclosure, the pixel array further includes a plurality of second narrowband filters. The plurality of the second narrowband filters are configured to generate a second narrowband information in accordance with the raw data. The first model unit further reconstructs the edge information from the second narrowband information based on another one of the plurality of the diffraction patterns.

In one embodiment of the present disclosure, a second spectrum linewidth of the plurality of the second narrowband filters is in a range from 5 nm to 70 nm and different from the first spectrum linewidth.

In one embodiment of the present disclosure, one of the plurality of the color filters is located between the plurality of the first narrowband filters and the plurality of the second narrowband filters.

In one embodiment of the present disclosure, the plurality of the second narrowband filters are adjacent to the plurality of the first narrowband filters, and the plurality of the second narrowband filters are surrounded by the plurality of the color filters.

In one embodiment of the present disclosure, an area ratio of the plurality of the first narrowband filters in the pixel array is the same as an area ratio of the plurality of the second narrowband filters in the pixel array.

According to an embodiment of the present disclosure, an operating method of an under-display camera system includes: providing a raw data by a pixel array; generating, by a plurality of color filters respectively disposed on a plurality of first photodiodes of the pixel array, a color information in accordance with the raw data; generating, by a plurality of first narrowband filters respectively disposed on a plurality of second photodiodes of the pixel array, a first narrowband information in accordance with the raw data, wherein a spectrum linewidth of the plurality of first narrowband filters is in a range from 5 nm to 70 nm; reconstructing an edge information from the first narrowband information based on one of a plurality of diffraction patterns provided by a database unit of a point spread function; and obtaining an image by combining the edge information with the color information.

In one embodiment of the present disclosure, the plurality of the first narrowband filters correspond to a wavelength same as the one of the plurality of the diffraction patterns.

In one embodiment of the present disclosure, the method further includes generating, by a plurality of second narrowband filters of the pixel array, a second narrowband information in accordance with the raw data.

In one embodiment of the present disclosure, reconstructing the edge information further includes reconstructing the edge information from the second narrowband information based on another one of the plurality of the diffraction patterns.

In one embodiment of the present disclosure, the database unit of the point spread function is built by: tagging each of the plurality of the diffraction patterns generated by a plurality of single wavelengths, respectively, passing through a display; and storing the plurality of the diffraction patterns.

In one embodiment of the present disclosure, reconstructing the edge information is performed by a first model unit, and the first model unit is trained by: providing a first image generated by a single wavelength passing through a display, a second image related to a formula of the point spread function, and a third image generated by the single wavelength without passing through the display; reconstructing a fourth image by combining the first image and the second image; comparing the third image with the fourth image; and adjusting fitting parameters of the formula if the fourth image is not substantially similar to the third image.

In one embodiment of the present disclosure, obtaining the image is performed by a second model unit, and the second model unit is trained by: providing the fourth image, a fifth image generated by a plurality of wavelengths passing through the display and a sixth image generated by the plurality of the wavelengths without passing through the display; reconstructing a seventh image by combining the fourth image and the fifth image; and comparing the sixth image with the seventh image.

In the aforementioned embodiments of the present disclosure, the pixel array includes the plurality of first narrowband filters configured to generate the first narrowband information. The first model unit may reconstruct the edge information from the first narrowband information based on the one of the plurality of the diffraction patterns provided by the database unit of the point spread function. Moreover, the second model unit may combine the edge information with the color information provided by the plurality of the color filters to obtain an image. Since the combination of the first model unit, the plurality of the first narrowband filters and the database unit of the point spread function may resolve diffraction problems, an image with higher resolution is obtained. As a result, a performance of the under-display camera system is improved.

DETAILED DESCRIPTION

Figure 1:
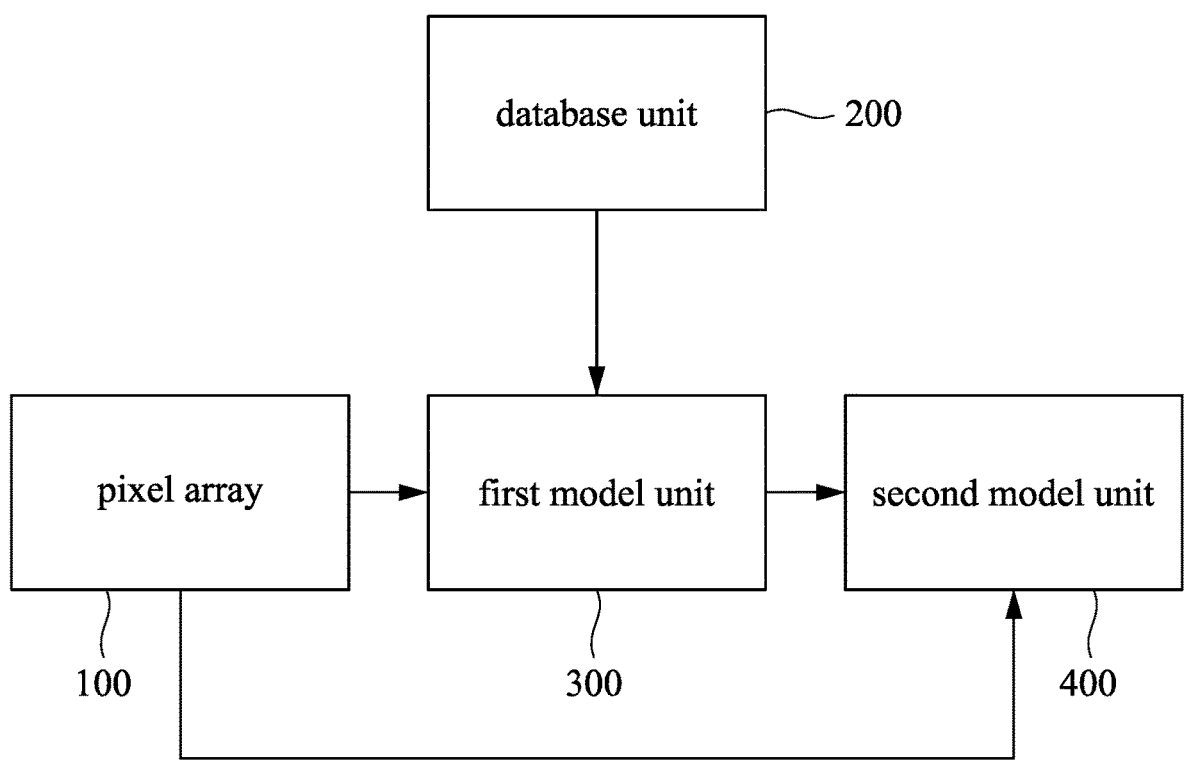
FIG. 1 illustrates a block view of an under-display camera system according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block view of an under-display camera system 10 according to one embodiment of the present disclosure. The under-display camera system 10 includes a pixel array 100, a database unit 200, a first model unit 300 and a second model unit 400. The pixel array 100 is configured to provide a raw data. The database unit 200 of point spread function is configured to store a plurality of diffraction patterns. The database unit 200 of the point spread function may be wavelength-dependent. For example, the point spread function may include diffraction information of a single wavelength passing through a display. The database unit 200 of the point spread function may be trained in a laboratory. The first model unit 300 is electrically connected with the pixel array 100, the database unit 200 and the second model unit 400. The first model unit 300 may be a deep neural network (DNN). The deep neural network may be combined with multiple types of neural networks, such as convolutional neural networks (CNN), recurrent neural networks (RNN) or others, and multiple optimization algorithms. For example, the neural networks need to be trained with sufficient images blurred by the diffraction and corresponding point spread function together. The second model unit 400 is electrically connected with the pixel array 100 and the first model unit 300. The second model unit 400 may be another deep neural network having different inputs from the first model unit 300.

Figure 2A:
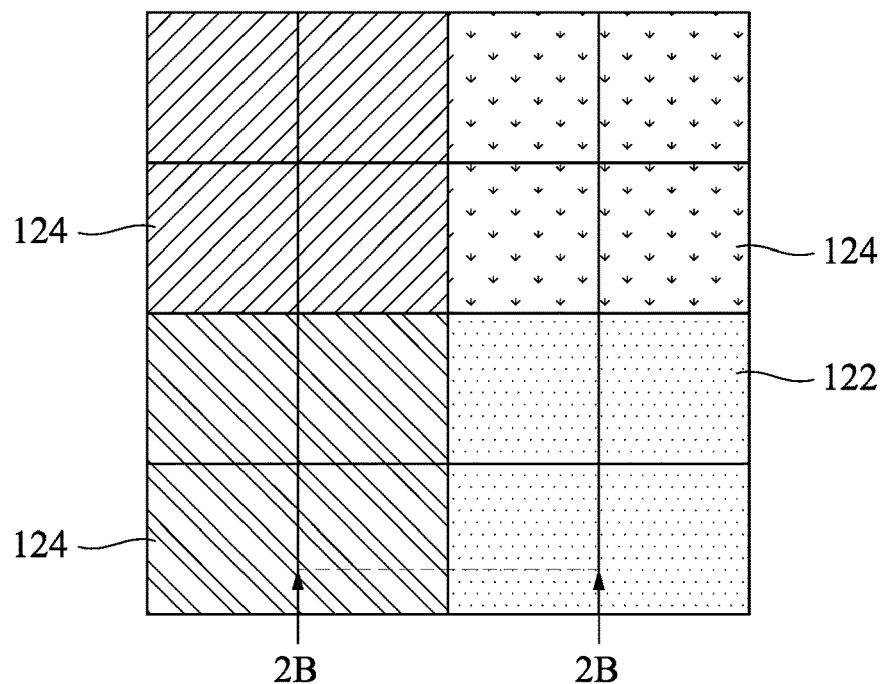
FIG. 2A illustrates a top view of a pixel array according to one embodiment of the present disclosure.
Figure 2B:
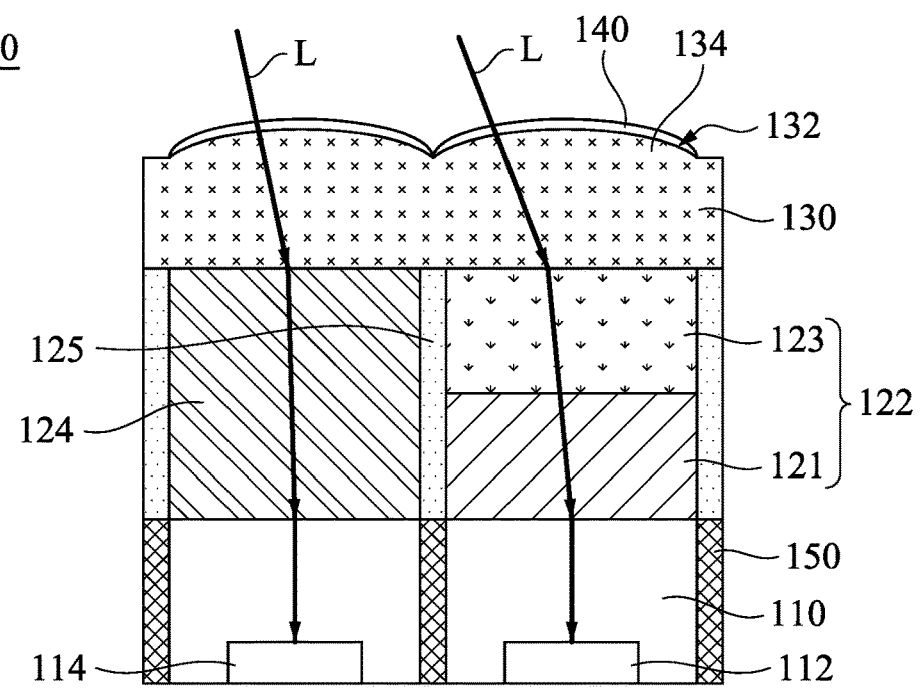
FIG. 2B illustrates a cross-sectional view of the pixel array of FIG. 2A along a line segment 2B-2B.

FIG. 2A illustrates a top view of the pixel array 100 of FIG. 1. FIG. 2B illustrates a cross-sectional view of the pixel array 100 of FIG. 2A along a line segment 2B-2B. Referring to FIG. 1, FIG. 2A and FIG. 2B, the pixel array 100 includes a semiconductor substrate 110, a plurality of first narrowband filters 122, a plurality of color filters 124, and a microlens layer 130. The plurality of the color filters 124 are disposed on a plurality of first photodiodes 114, respectively, and configured to generate a color information in accordance with the raw data. For example, the plurality of the color filters 124 may correspond to different wavelengths (such as wavelengths of red light, green light and blue light). The plurality of the first narrowband filters 122 are disposed on a plurality of second photodiodes 112, respectively, and configured to generate a first narrowband information in accordance with the raw data. A spectrum linewidth of the plurality of the color filters 124 is in a range from 150 nm to 200 nm. It is to be noted that a first spectrum linewidth of the plurality of the first narrowband filters 122 is in a range from 5 nm to 70 nm. The plurality of the first narrowband filters 122 correspond to a first single wavelength, and the first single wavelength is in a range from 400 nm to 1000 nm. The first single wavelength is same as a wavelength corresponding to the one of the plurality of the diffraction patterns.

In addition, the first model unit 300 receives the first narrowband information from the pixel array 100. The first model unit 300 is configured to reconstruct an edge information from the first narrowband information based on one of the plurality of the diffraction patterns provided by the database unit 200 of the point spread function. The second model unit 400 is configured to obtain an image by combining the edge information with the color information.

Specifically, the pixel array 100 includes the plurality of first narrowband filters 122 configured to generate the first narrowband information. The first model unit 300 may reconstruct the edge information from the first narrowband information based on the one of the plurality of the diffraction patterns provided by the database unit 200 of the point spread function. Moreover, the second model unit 400 may combine the edge information with the color information provided by the plurality of the color filters 124 to obtain an image. Since the combination of the first model unit 300, the plurality of the first narrowband filters 122 and the database unit 200 of the point spread function may resolve diffraction problems, an image with higher resolution is obtained. As a result, a performance of the under-display camera system 10 is improved.

The microlens layer 130 is disposed on the pixel array 100 and is configured to transmit light L to the plurality of the first narrowband filters 122 and the plurality of the color filters 124. The microlens layer 130 includes a plurality of microlenses 134. The plurality of microlenses 134 overlap the plurality of the first narrowband filters 122 and the plurality of the color filters 124. A grid 125 is located between one of the plurality of the first narrowband filters 122 and one of the plurality of the color filters 124. In some embodiments, the grid 125 may be located between adjacent two of the plurality of the color filters 124. Each of the plurality of the first narrowband filters 122 includes a first portion 121 and a second portion 123 disposed on the first portion 121. The first portion 121 corresponds to a first spectrum same as one of the plurality of the color filters 124, and the second portion 123 corresponds to a second spectrum different from the first spectrum.

Moreover, if the first spectrum of the first portion 121 corresponds to the wavelength of green light and the second spectrum of the second portion 123 corresponds to the wavelength of red light, the first spectrum linewidth of the plurality of the first narrowband filters 122 may be 42 nm. If the first spectrum of the first portion 121 corresponds to the wavelength of green light and the second spectrum of the second portion 123 corresponds to the wavelength of blue light, the first spectrum linewidth of the plurality of the first narrowband filters 122 may be 52 nm. In some embodiments, the pixel array 100 further includes a protecting layer 140 and a shielding element 150. The protecting layer 140 covers a top surface 132 of the microlens layer 130. The shielding element 150 is configured to avoid interference from the plurality of the first photodiodes 114 and the second photodiodes 112.

It is to be noted that the connection relationship of the aforementioned elements will not be repeated. In the following description, other types of pixel arrays will be described.

Figure 2C:
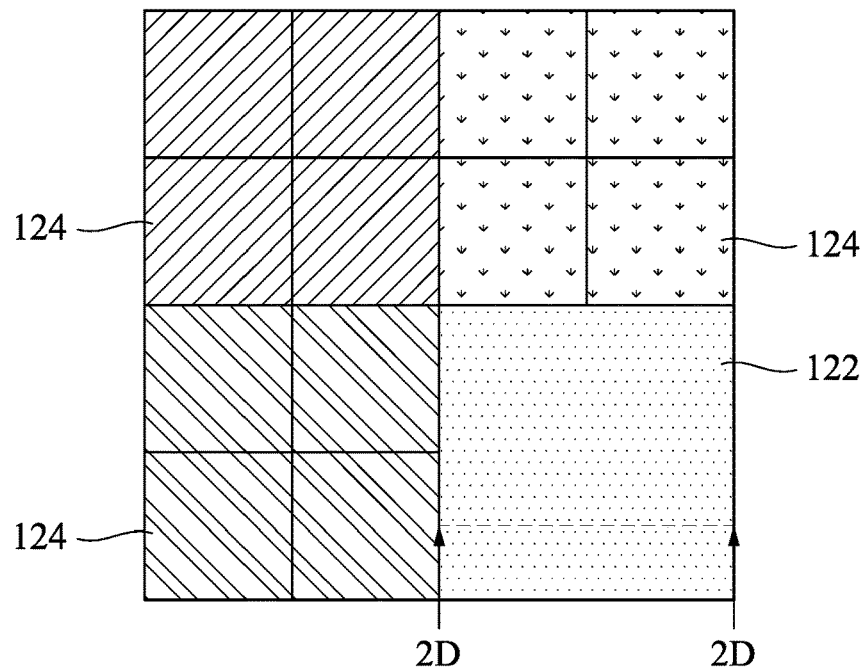
FIG. 2C illustrates a top view of a pixel array according to another embodiment of the present disclosure.
Figure 2D:
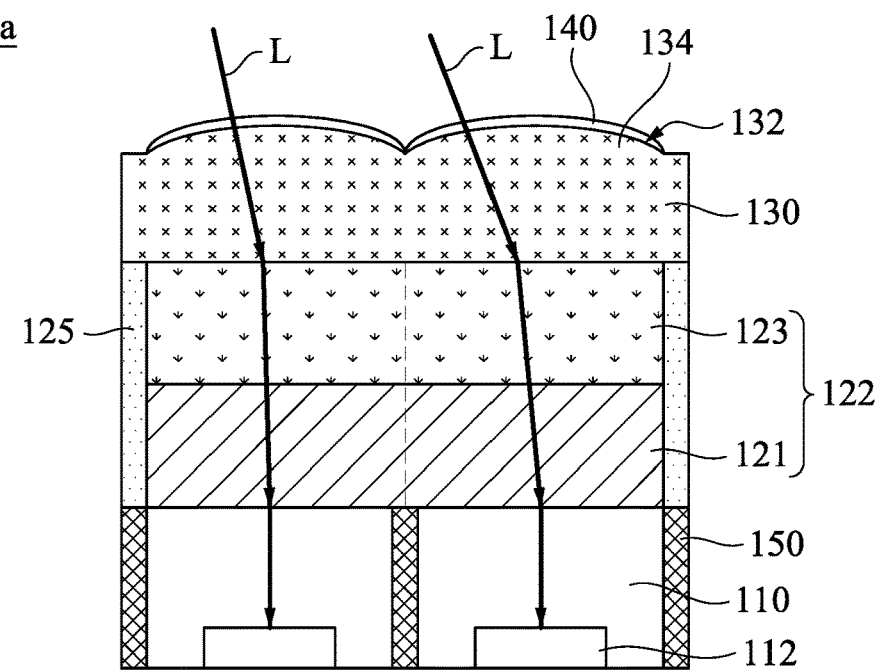
FIG. 2D illustrates a cross-sectional view of the pixel array of FIG. 2C along a line segment 2D-2D.

FIG. 2C illustrates a top view of a pixel array 100a according to another embodiment of the present disclosure. FIG. 2D illustrates a cross-sectional view of the pixel array 100a of FIG. 2C along a line segment 2D-2D. Referring to both FIG. 2C and FIG. 2D, the difference between the pixel array 100a and the pixel array 100 shown in FIG. 2A and FIG. 2B is that no grid 125 is located between adjacent two of the plurality of the first narrowband filters 122 such that an efficiency to absorb light of the plurality of the second photodiodes 112 may be improved. Moreover, adjacent two of the plurality of the first narrowband filters 122 are merged.

Figure 2E:
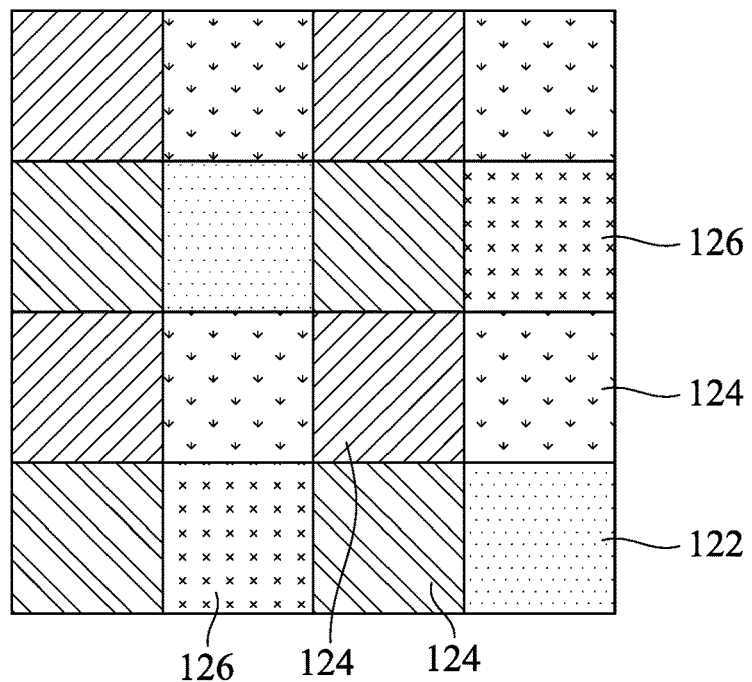
FIG. 2E to FIG. 2H illustrate top views of pixel arrays according to some embodiments of the present disclosure.
Figure 2F:
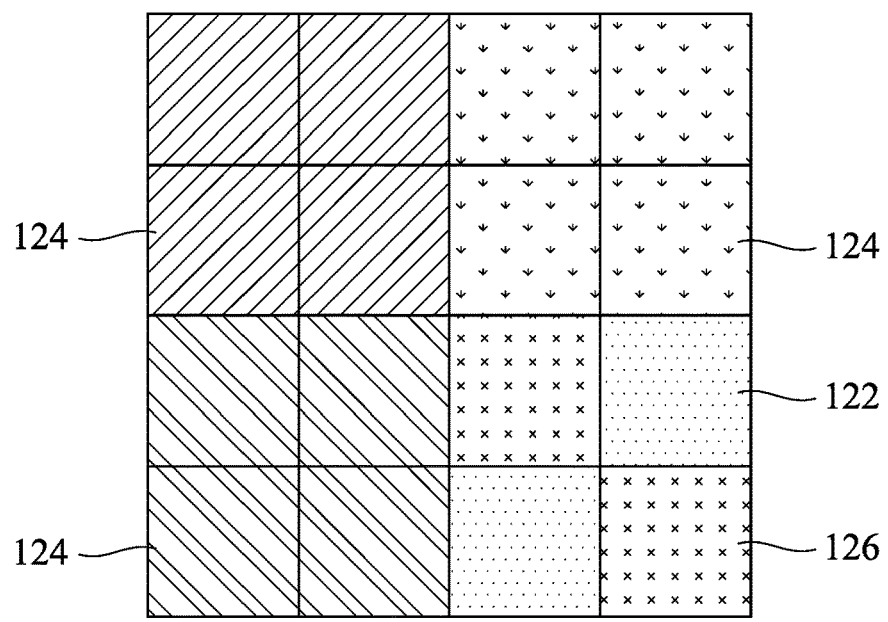

FIG. 2E to FIG. 2H illustrate top views of pixel arrays according to some embodiments of the present disclosure. Referring to FIG. 2E, a pixel array 100c further includes a plurality of second narrowband filters 126. The plurality of the second narrowband filters 126 are configured to generate a second narrowband information in accordance with the raw data. The first model unit 300 (see FIG. 1) further reconstructs the edge information from the second narrowband information based on another one of the plurality of the diffraction patterns provided by the database unit 200 (see FIG. 1) of the point spread function. The plurality of the second narrowband filters 126 correspond to a second single wavelength, and the second single wavelength is same as a wavelength corresponding to the another one of the plurality of the diffraction patterns. It is to be noted that a second spectrum linewidth of the plurality of the second narrowband filters 126 is in a range from 5 nm to 70 nm and different from the first spectrum linewidth. In this embodiment, one of the plurality of the color filters 124 is located between the plurality of the first narrowband filters 122 and the plurality of the second narrowband filters 126. Referring to FIG. 2F, the difference between a pixel array 100d and the pixel array 100c shown in FIG. 2E is that the plurality of the second narrowband filters 126 are adjacent to the plurality of the first narrowband filters 122.

Figure 2G:
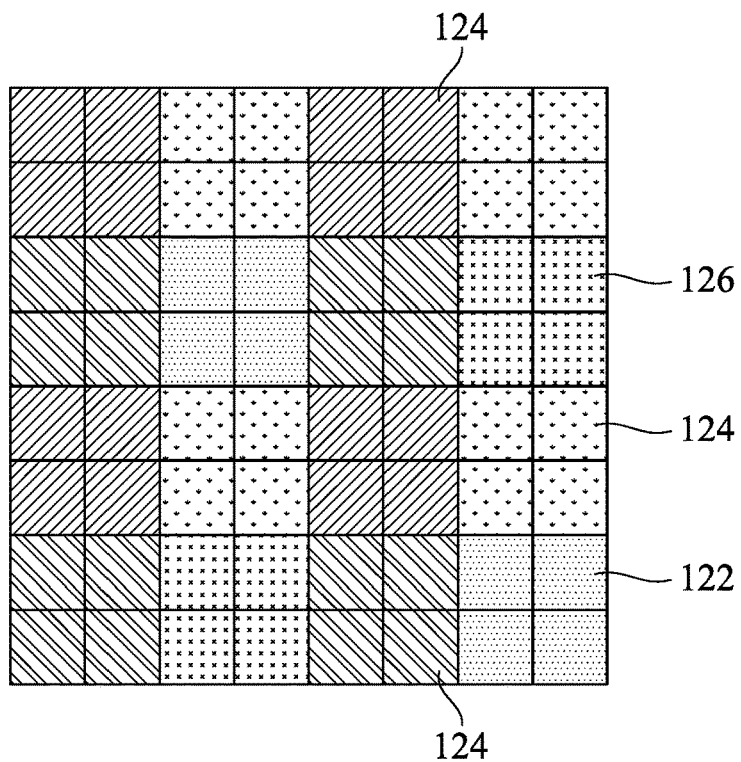
Figure 2H:
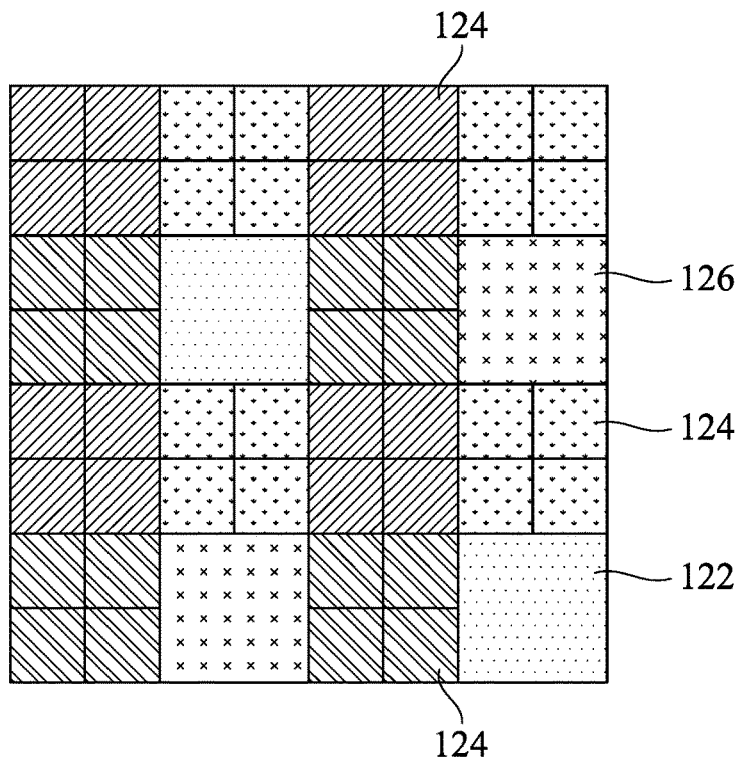

Referring to FIG. 2G, a pixel array 100e is a 8×8 array, and an area ratio of the plurality of the first narrowband filters 122 in the pixel array 100e is the same as an area ratio of the plurality of the second narrowband filters 126 in the pixel array 100e. Referring to FIG. 2H, the difference between a pixel array 100f and the pixel array 100e shown in FIG. 2G is that no grid is located between adjacent two of the plurality of the first narrowband filters 122, and no grid is located between adjacent two of the plurality of the second narrowband filters 126. Moreover, adjacent two of the plurality of the first narrowband filters 122 are merged, and adjacent two of the plurality of the second narrowband filters 126 are merged.

Figure 3A:
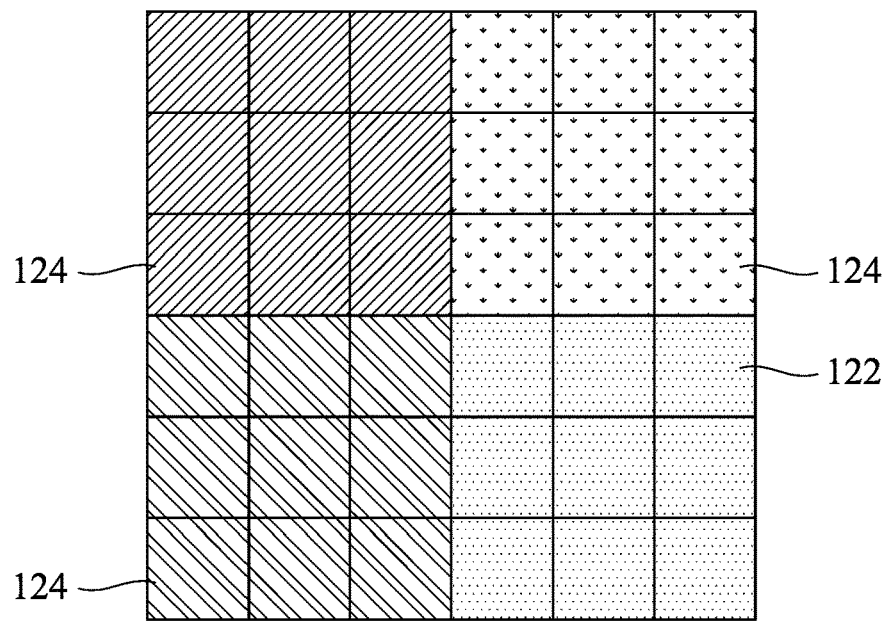
FIG. 3A to FIG. 3C illustrate top views of pixel arrays according to other embodiments of the present disclosure.
Figure 3B:
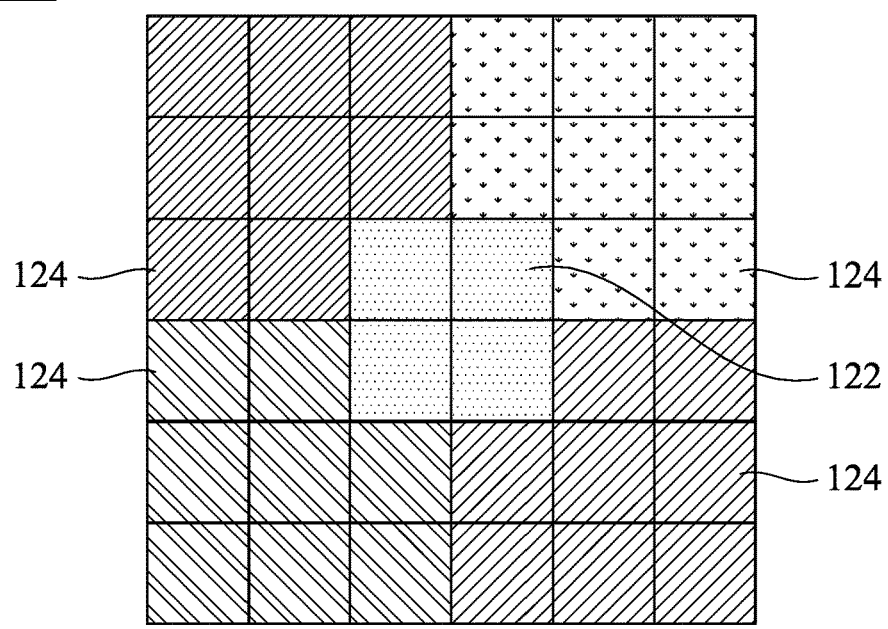
Figure 3C:
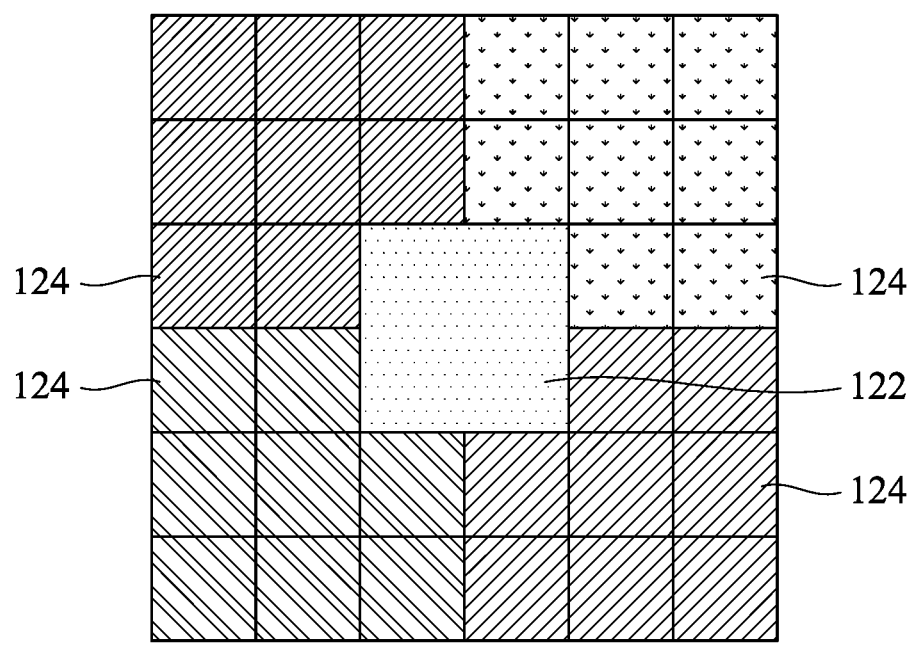

FIG. 3A to FIG. 3C illustrate top views of pixel arrays according to other embodiments of the present disclosure. Referring to FIG. 3A, a pixel array 300a is a 6×6 matrix, and an area ratio of the plurality of the first narrowband filters 122 in the pixel array 300a is 25%. Referring to FIG. 3B, a pixel array 300b includes the plurality of the first narrowband filters 122 and the plurality of the color filters 124. In this embodiment, the plurality of the first narrowband filters 122 are surrounded by the plurality of the color filters 124. Referring to FIG. 3C, the difference between a pixel array 300c and the pixel array 300b shown in FIG. 3B is that no grid is located between adjacent two of the plurality of the first narrowband filters 122. In this embodiment, an area ratio of the plurality of the first narrowband filters 122 in the pixel array 300c is about 11%.

Figure 4A:
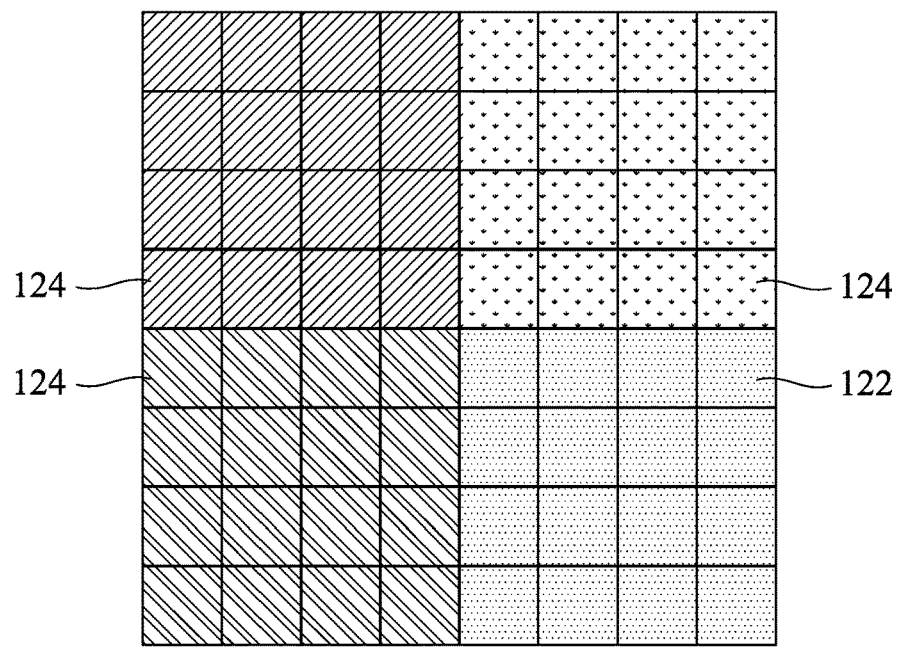
FIG. 4A to FIG. 4L illustrate top views of pixel arrays according to other embodiments of the present disclosure.
Figure 4B:
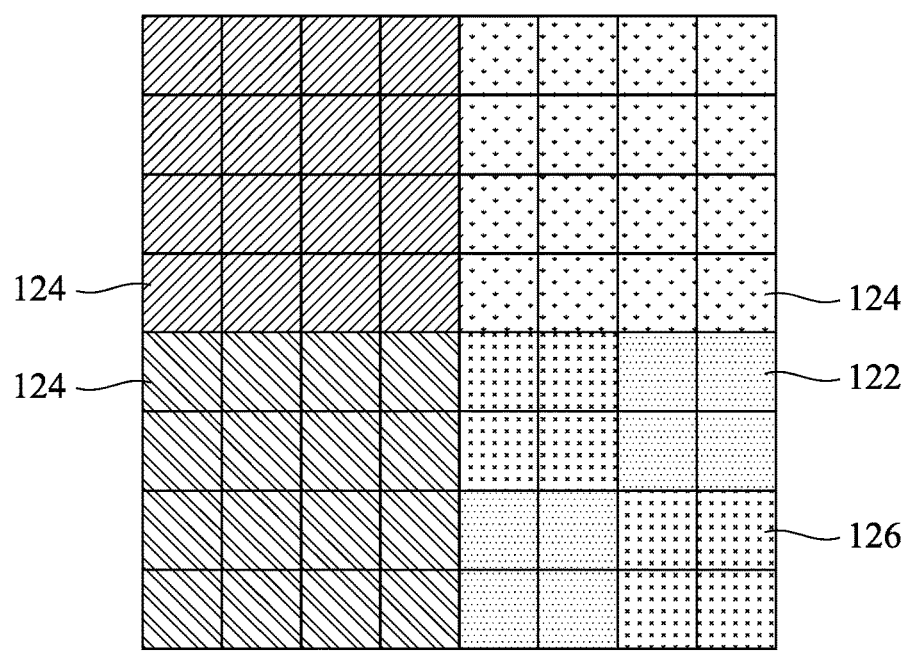

FIG. 4A to FIG. 4L illustrate top views of pixel arrays according to other embodiments of the present disclosure. Referring to FIG. 4A, a pixel array 400a shown in FIG. 4A is a 8×8 matrix, and an area ratio of the plurality of the first narrowband filters 122 in the pixel array 400a is 25%. Referring to FIG. 4B, a pixel array 400b includes the plurality of the first narrowband filters 122 and the plurality of the second narrowband filters 126. An area ratio of the plurality of the first narrowband filters 122 in the pixel array 400b is the same as an area ratio of the plurality of the second narrowband filters 126 in the pixel array 400b.

Figure 4C:
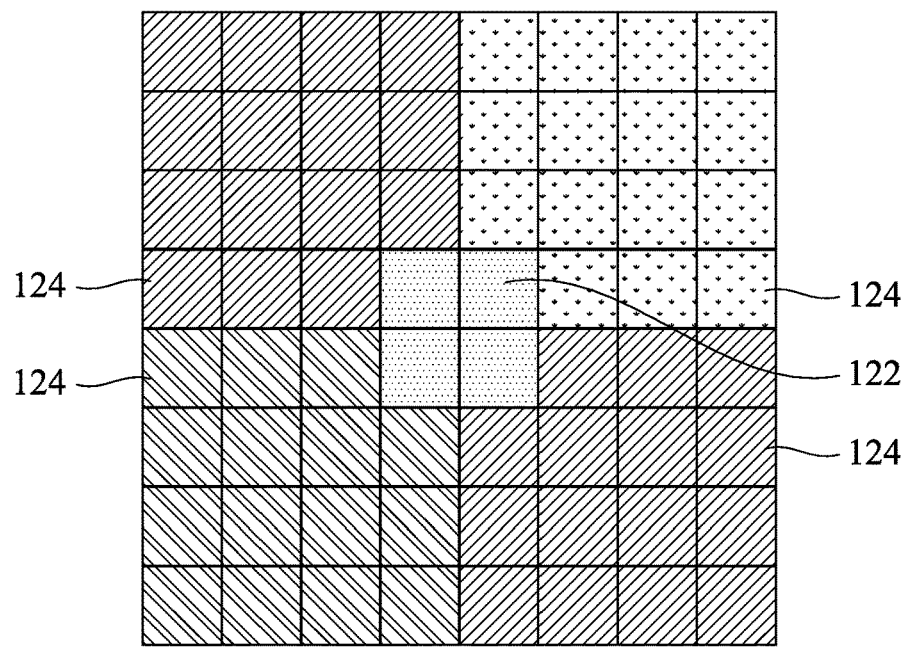
Figure 4D:
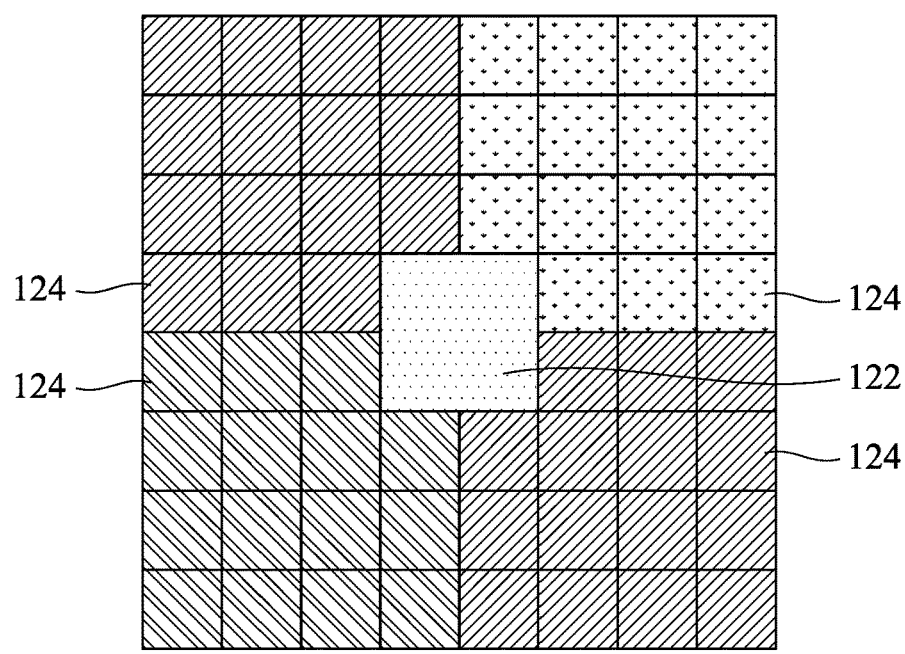

Referring to FIG. 4C, a pixel array 400c is a 8×8 array, and an area ratio of the plurality of the first narrowband filters 122 in the pixel array 400c is about 6.25%. Referring to FIG. 4D, the difference between a pixel array 400d and the pixel array 400c shown in FIG. 4C is that no grid is located between adjacent two of the plurality of the first narrowband filters 122.

Figure 4E:
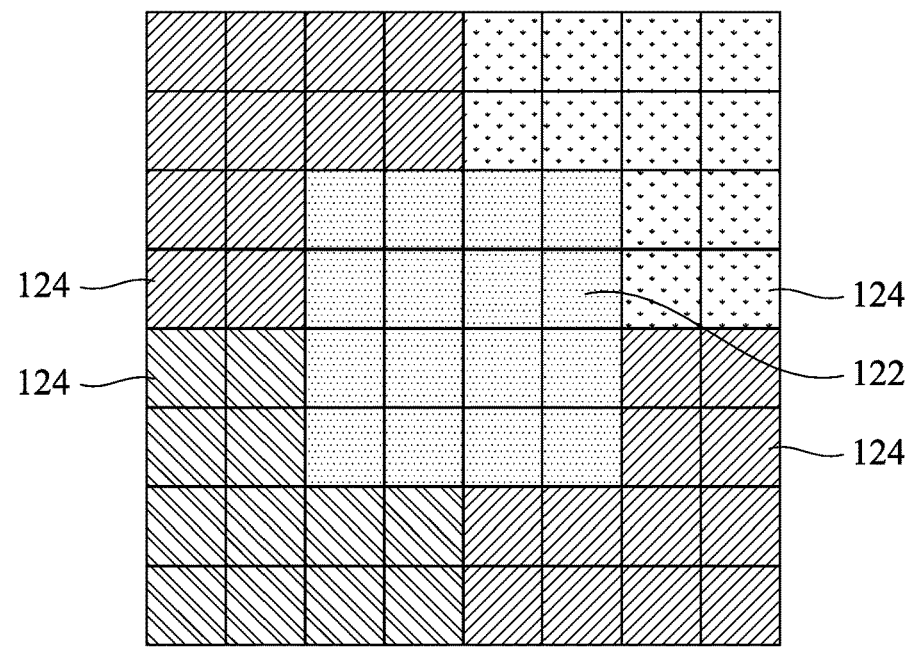
Figure 4F:
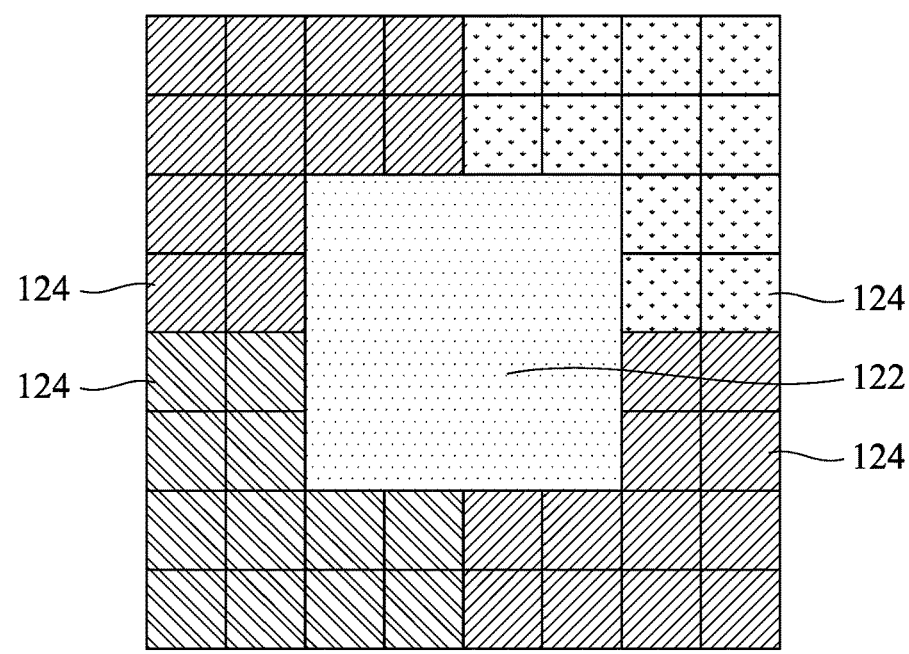

Referring to FIG. 4E, a pixel array 400e is a 8×8 array, and the plurality of the first narrowband filters 122 are surrounded by the plurality of the color filters 124. Referring to FIG. 4F, the difference between a pixel array 400f and the pixel array 400e shown in FIG. 4E is that no grid is located between adjacent two of the plurality of the first narrowband filters 122.

Figure 4G:
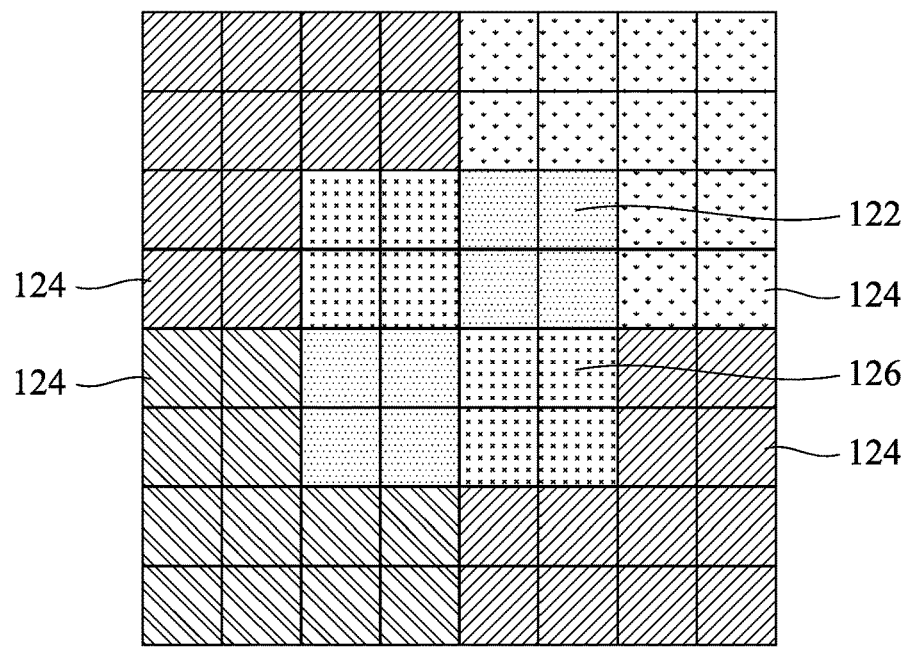
Figure 4H:
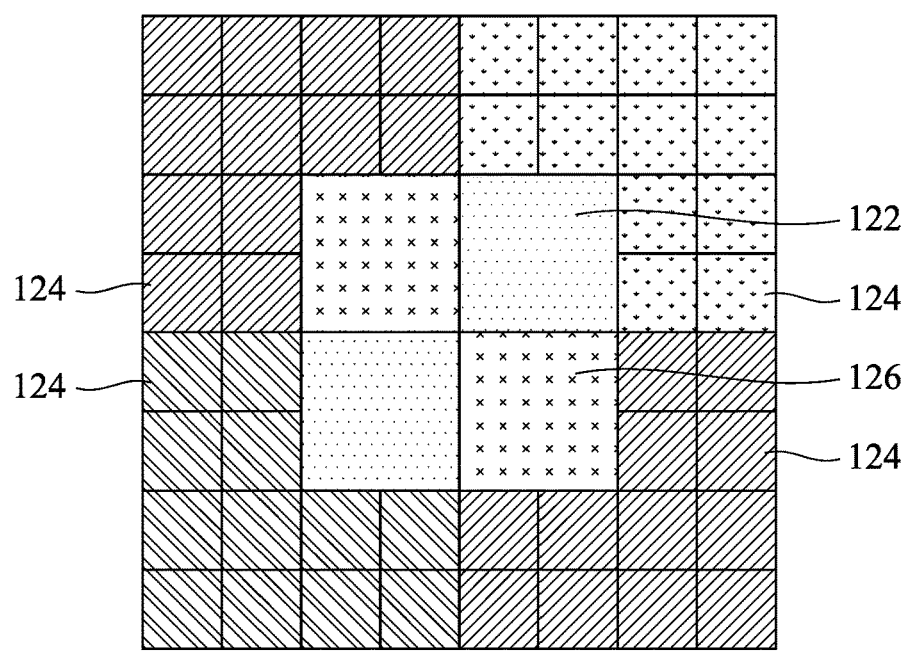

Referring to FIG. 4G, a pixel array 400g is a 8×8 array and includes the plurality of the first narrowband filters 122 and the second narrowband filters 126. In this embodiment, the plurality of the first narrowband filters 122 and the second narrowband filters 126 are surrounded by the plurality of the color filters 124. Referring to FIG. 4H, the difference between a pixel array 400h and the pixel array 400g shown in FIG. 4G is that no grid is located between adjacent two of the plurality of the first narrowband filters 122, and no grid is located between adjacent two of the plurality of the second narrowband filters 126.

Figure 4I:
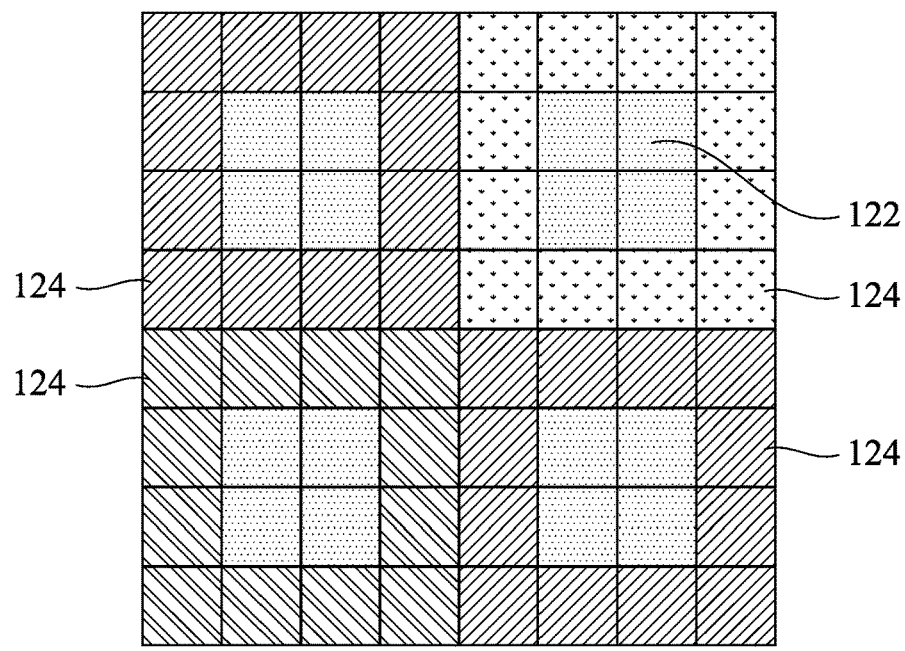
Figure 4J:
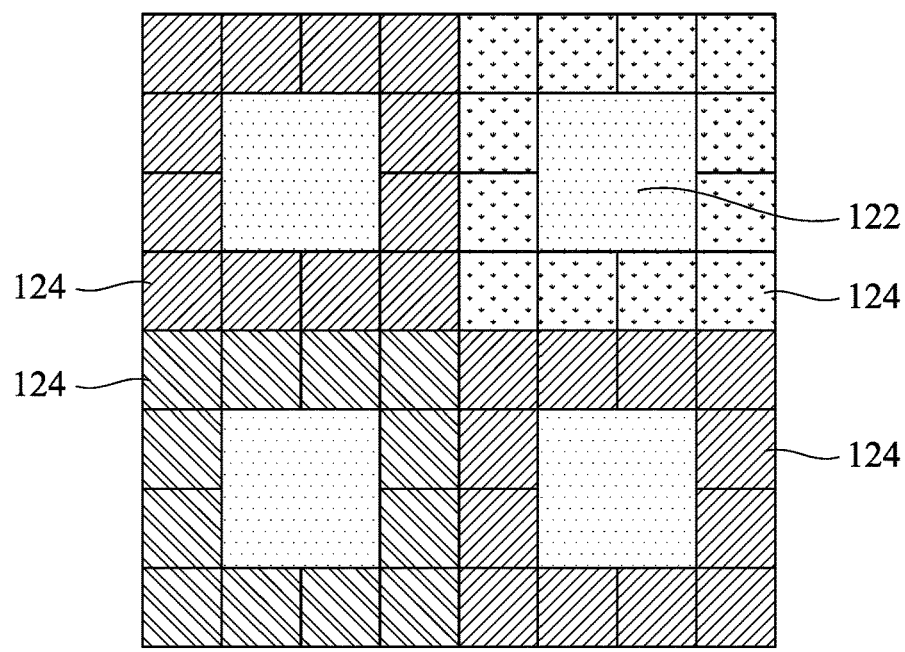

Referring to FIG. 4I, a pixel array 400i is a 8×8 array and includes the plurality of the first narrowband filters 122. In this embodiment, the plurality of the first narrowband filters 122 are surrounded by the plurality of the color filters 124. Referring to FIG. 4J, the difference between a pixel array 400j and the pixel array 400i shown in FIG. 4I is that no grid is located between adjacent two of the plurality of the first narrowband filters 122.

Figure 4K:
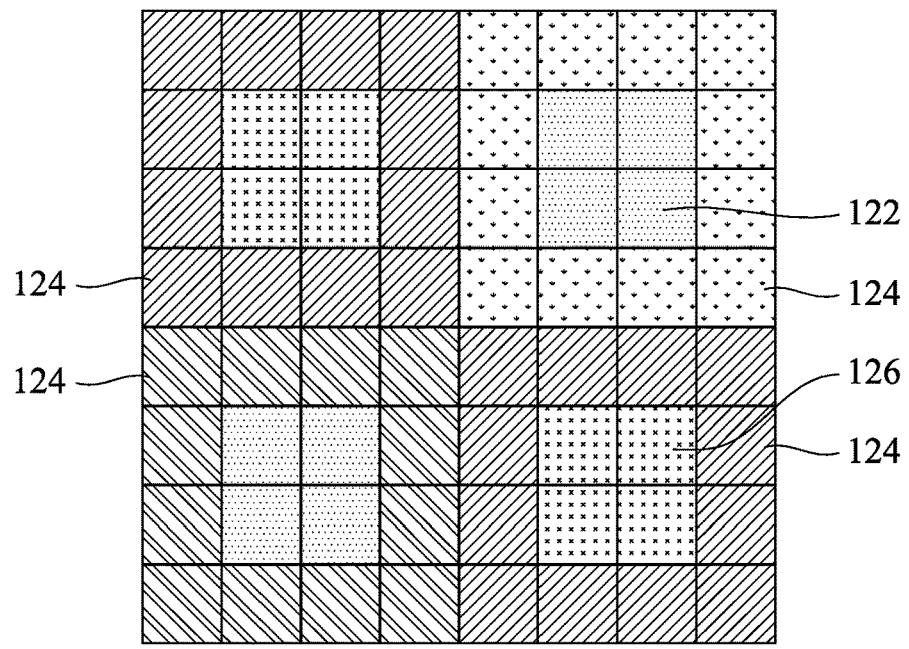
Figure 4L:
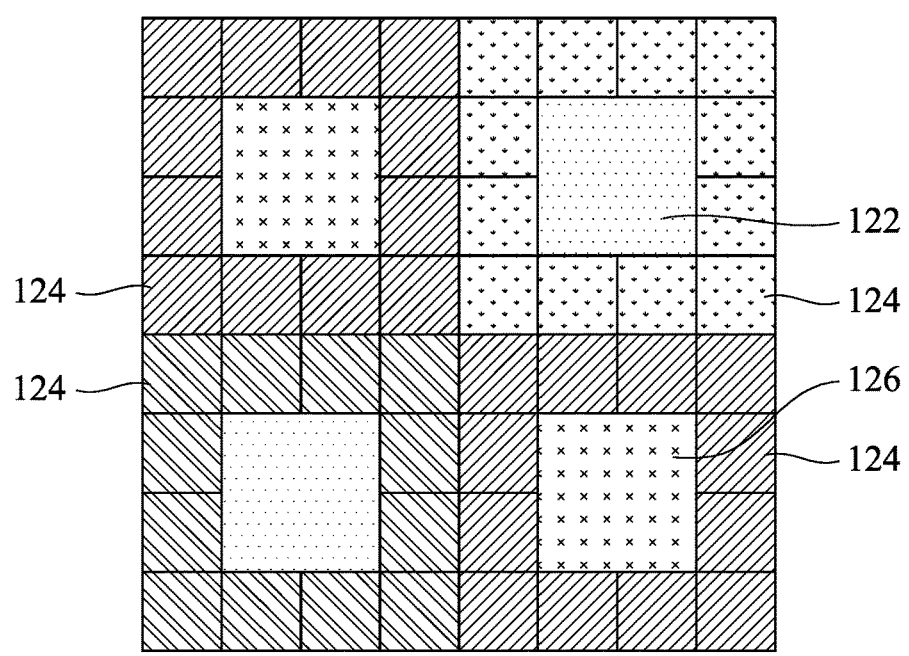

Referring to FIG. 4K, a pixel array 400k is a 8×8 array and includes the plurality of the first narrowband filters 122 and the second narrowband filters 126. In this embodiment, the plurality of the color filters 124 are located between the plurality of the first narrowband filters 122 and the second narrowband filters 126. The plurality of the first narrowband filters 122 and the second narrowband filters 126 are surrounded by the plurality of the color filters 124. Referring to FIG. 4L, the difference between a pixel array 400l and the pixel array 400k shown in FIG. 4K is that no grid is located between adjacent two of the plurality of the first narrowband filters 122, and no grid is located between adjacent two of the plurality of the second narrowband filters 126.

In the following description, an operating method of an under-display camera will be described.

Figure 5:
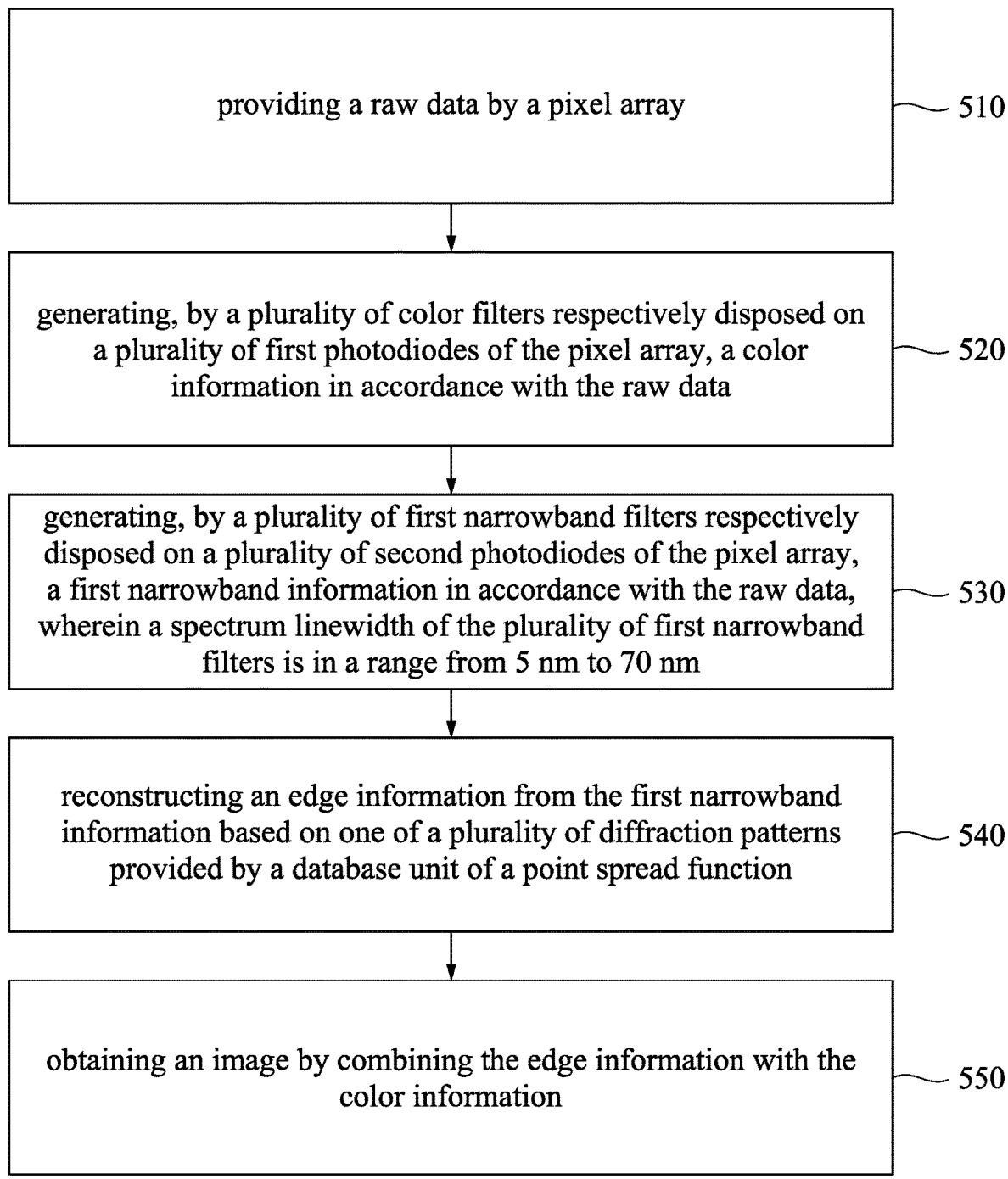
FIG. 5 illustrates a flow chart of an operating method of an under-display camera system according to one embodiment of the present disclosure.

FIG. 5 illustrates a flow chart of an operating method of an under-display camera system according to one embodiment of the present disclosure. The operating method of the under-display camera system includes steps as outlined below. In step 510, a raw data is provided by a pixel array. In step 520, a color information is generated, by a plurality of color filters respectively disposed on a plurality of first photodiodes of the pixel array, in accordance with the raw data. In step 530, a first narrowband information is generated, by a plurality of first narrowband filters respectively disposed on a plurality of second photodiodes of the pixel array, in accordance with the raw data, wherein a spectrum linewidth of the plurality of first narrowband filters is in a range from 5 nm to 70 nm. In step 540, an edge information is reconstructed from the first narrowband information based on one of a plurality of diffraction patterns provided by a database unit of a point spread function. In step 550, an image is obtained by combining the edge information with the color information. In the following description, the aforementioned steps will be described in detail.

Figure 6:
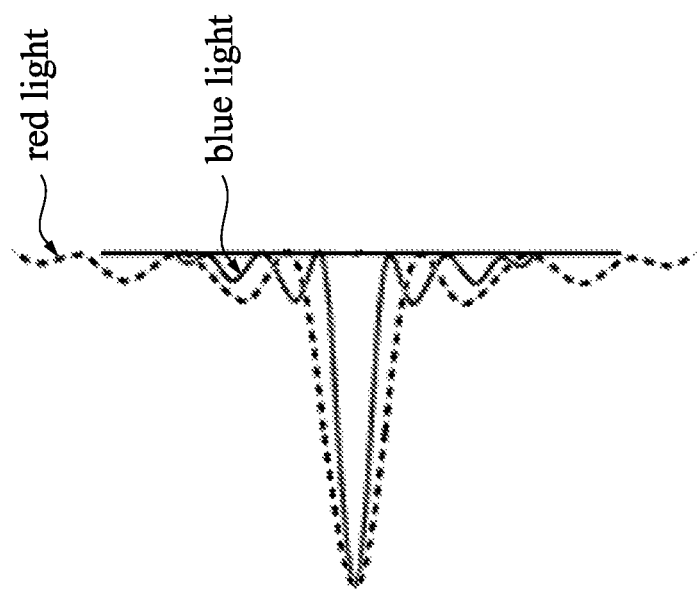
FIG. 6 illustrates a principle of the diffraction patterns corresponding to different wavelengths according to one embodiment of the present disclosure.
Figure 6:
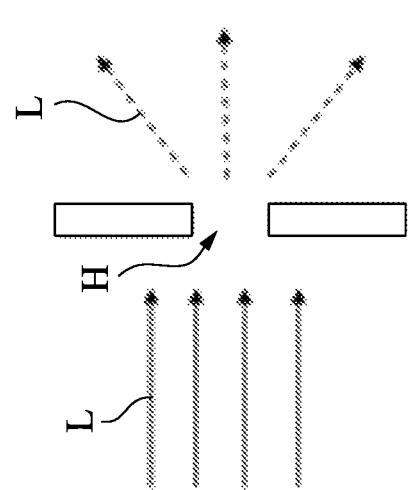
Figure 7:
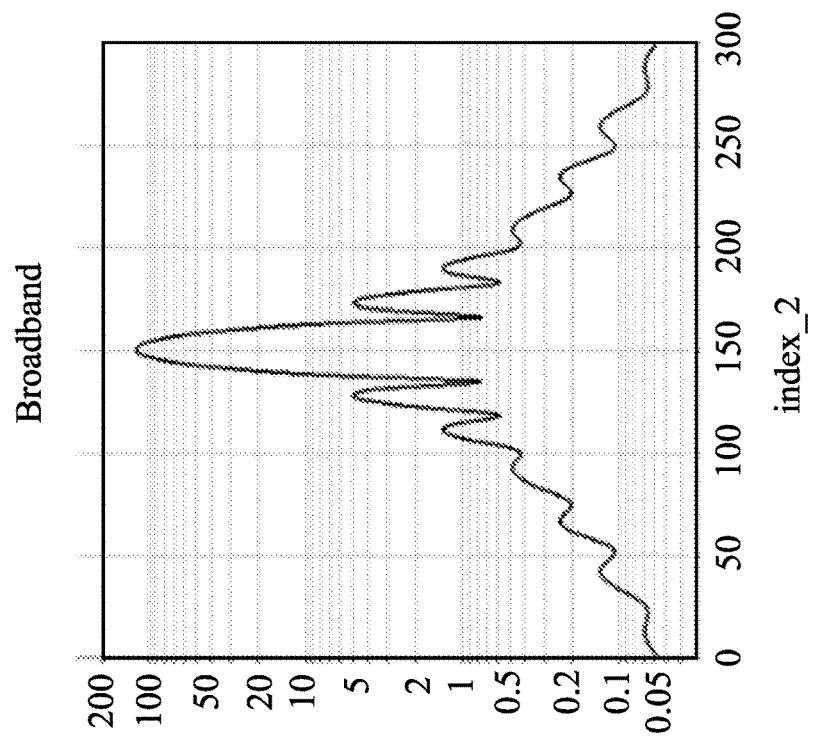
FIG. 7 illustrates a difference of the diffraction patterns between a narrowband light and a broadband light according to one embodiment of the present disclosure.
Figure 7:
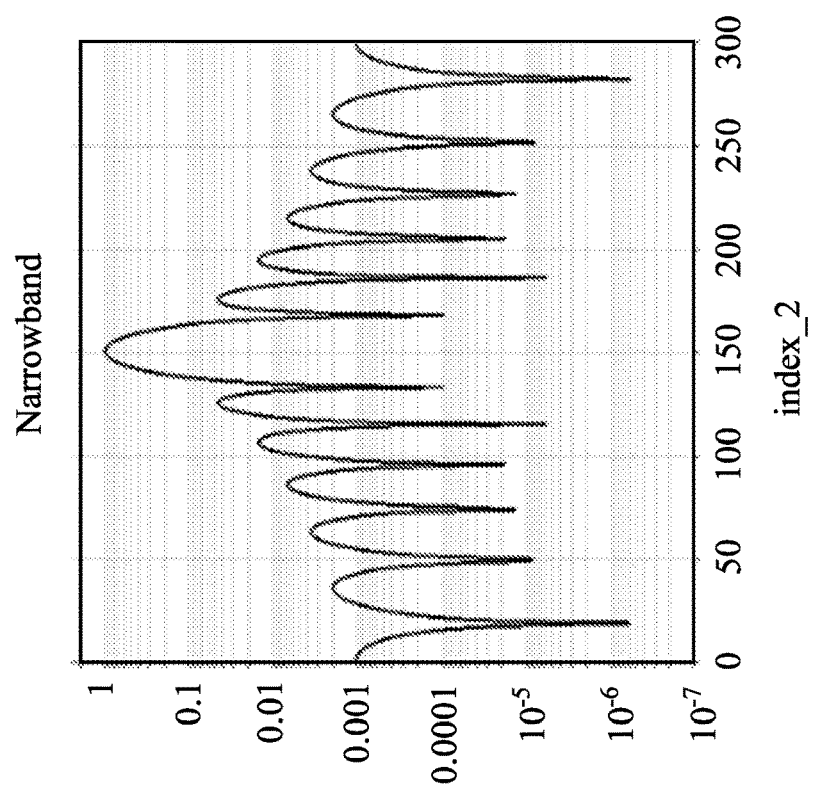

FIG. 6 illustrates a principle of the diffraction patterns corresponding to different wavelengths according to one embodiment of the present disclosure. FIG. 7 illustrates a difference of the diffraction patterns between a narrowband light and a broadband light according to one embodiment of the present disclosure. Referring to both FIG. 6 and FIG. 7, diffraction decreasing an image resolution is an issue to image restoration. Different wavelengths may obtain different diffraction patterns even though using the same diffraction structure as shown in FIG. 6. For example, when the light L passes through a hole H, the light L may generate different diffraction patterns corresponding to red light and blue light. FIG. 7 shows an example of a narrowband diffraction pattern and a broadband diffraction pattern. When all of the wavelength information is summed, the broadband diffraction pattern is generated as shown in FIG. 7. The broadband diffraction pattern loses detail information in comparison with the narrowband diffraction pattern. Because the narrowband diffraction pattern contains more information than the broadband diffraction pattern, the narrowband diffraction pattern may help to restore the image with a higher resolution to improve an overall performance.

Figure 8:
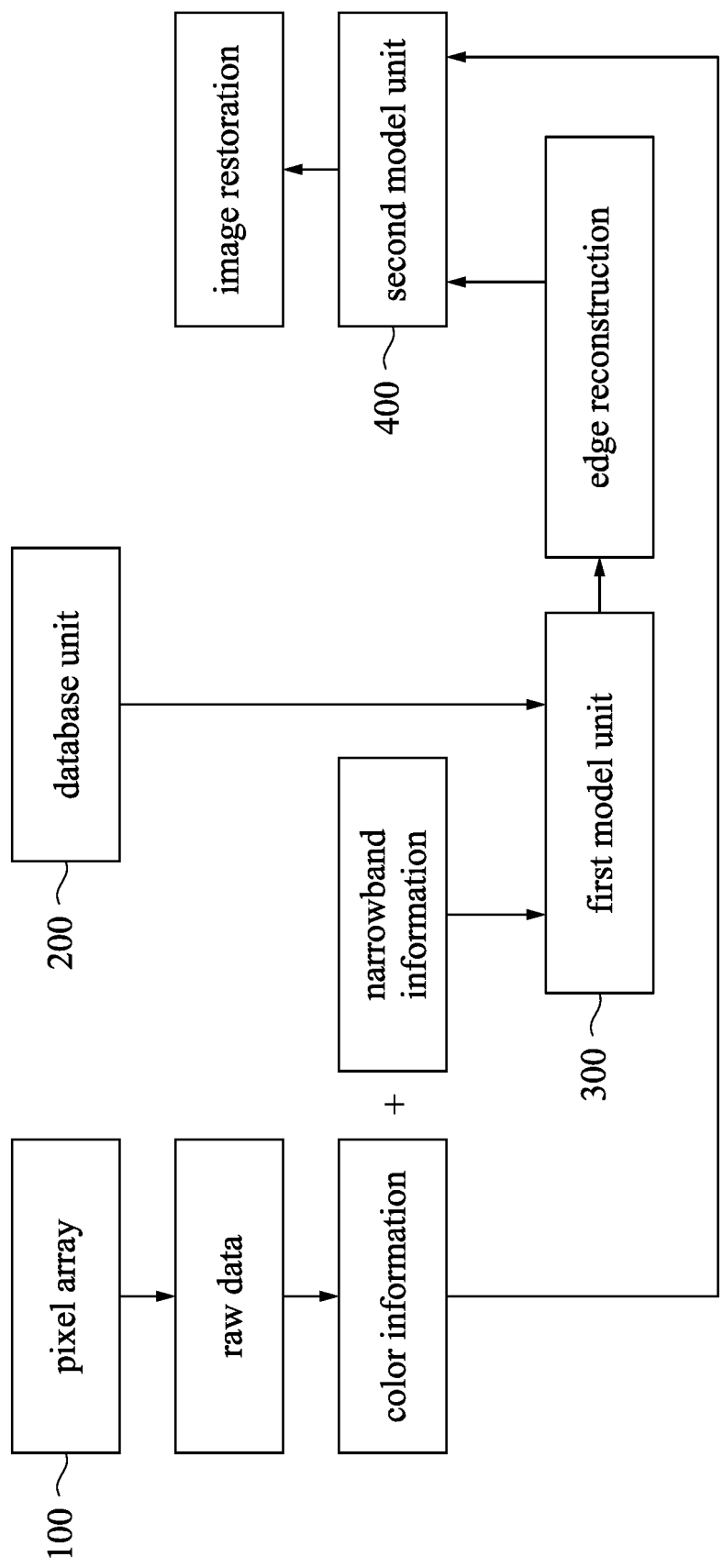
FIG. 8 illustrates a schematic view of operating an under-display camera system according to one embodiment of the present disclosure.

FIG. 8 illustrates a schematic view of operating an under-display camera system according to one embodiment of the present disclosure. Referring to FIG. 1, FIG. 2B and FIG. 8, the first model unit 300 may be the deep neural network (DNN). The deep neural network may be combined with multiple types of neural networks, such as convolutional neural networks (CNN), recurrent neural networks (RNN) or others, and multiple optimization algorithms. The first model unit 300 is electrically connected to the database unit 200 of the point spread function. The second model unit 400 is electrically connected to the pixel array 100 and the first model unit 300.

The pixel array 100 includes the plurality of first narrowband filters 122 configured to generate the first narrowband information. The first model unit 300 may reconstruct the edge information from the first narrowband information based on the one of the plurality of the diffraction patterns provided by the database unit 200 of the point spread function. In some embodiments, the plurality of the first narrowband filters 122 correspond to a wavelength same as the one of the plurality of the diffraction patterns. Moreover, the second model unit 400 may combine the edge information with the color information provided by the plurality of the color filters 124 to obtain an image. Since the combination of the first model unit 300, the plurality of the first narrowband filters 122 and the database unit 200 of the point spread function may resolve diffraction problems, an image with higher resolution is obtained. As a result, a performance of the under-display camera system 10 is improved.

The method further includes generating, by the plurality of the second narrowband filters 126 of the pixel array 100c as shown in FIG. 2E, the second narrowband information in accordance with the raw data. In addition, reconstructing the edge information further includes reconstructing the edge information from the second narrowband information based on another one of the plurality of the diffraction patterns. The different diffraction patterns may correspond to different wavelengths. A combination of the first narrowband information and the second narrowband information may provide the first model unit 300 to generate the edge information with higher resolution.

Figure 9:
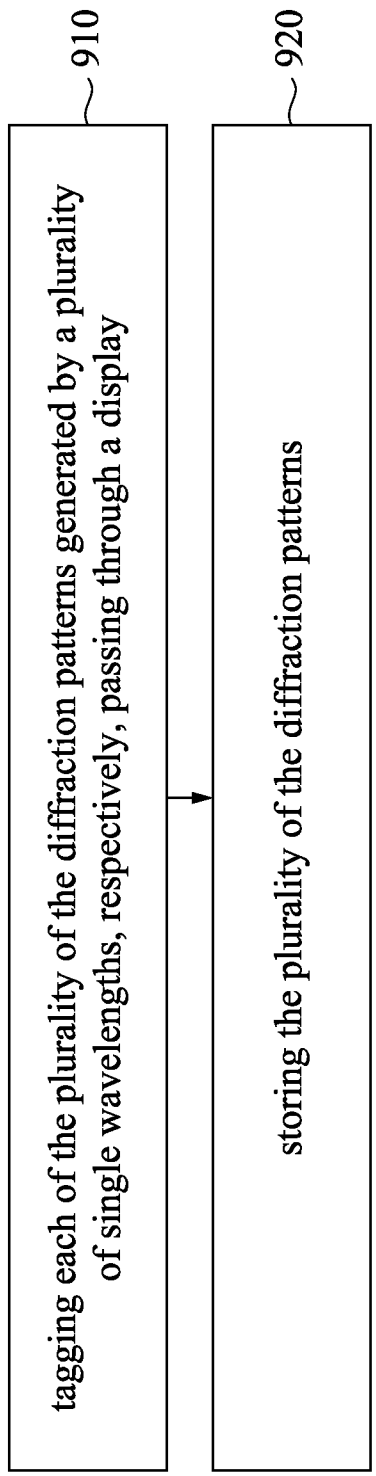
FIG. 9 illustrates a flow chart of a method of building a database unit according to one embodiment of the present disclosure.

Referring to both FIG. 8 and FIG. 9, FIG. 9 illustrates a flow chart of a method of building the database unit 200 according to one embodiment of the present disclosure. The method of building the database unit 200 includes steps as outlined below. In step 910, each of the plurality of the diffraction patterns generated by a plurality of single wavelengths, respectively, passing through a display is tagged. In step 920, the plurality of the diffraction patterns are stored. For example, when a single wavelength passes through a display, the diffraction pattern generated by the single wavelength is stored, and each of the plurality of the diffraction patterns corresponds to each of the plurality of the single wavelengths, respectively. Furthermore, the plurality of the first narrowband filters 122 (see FIG. 2A) correspond to the first single wavelength, and the first single wavelength is same as a wavelength corresponding to the one of the plurality of the diffraction patterns.

Figure 10:
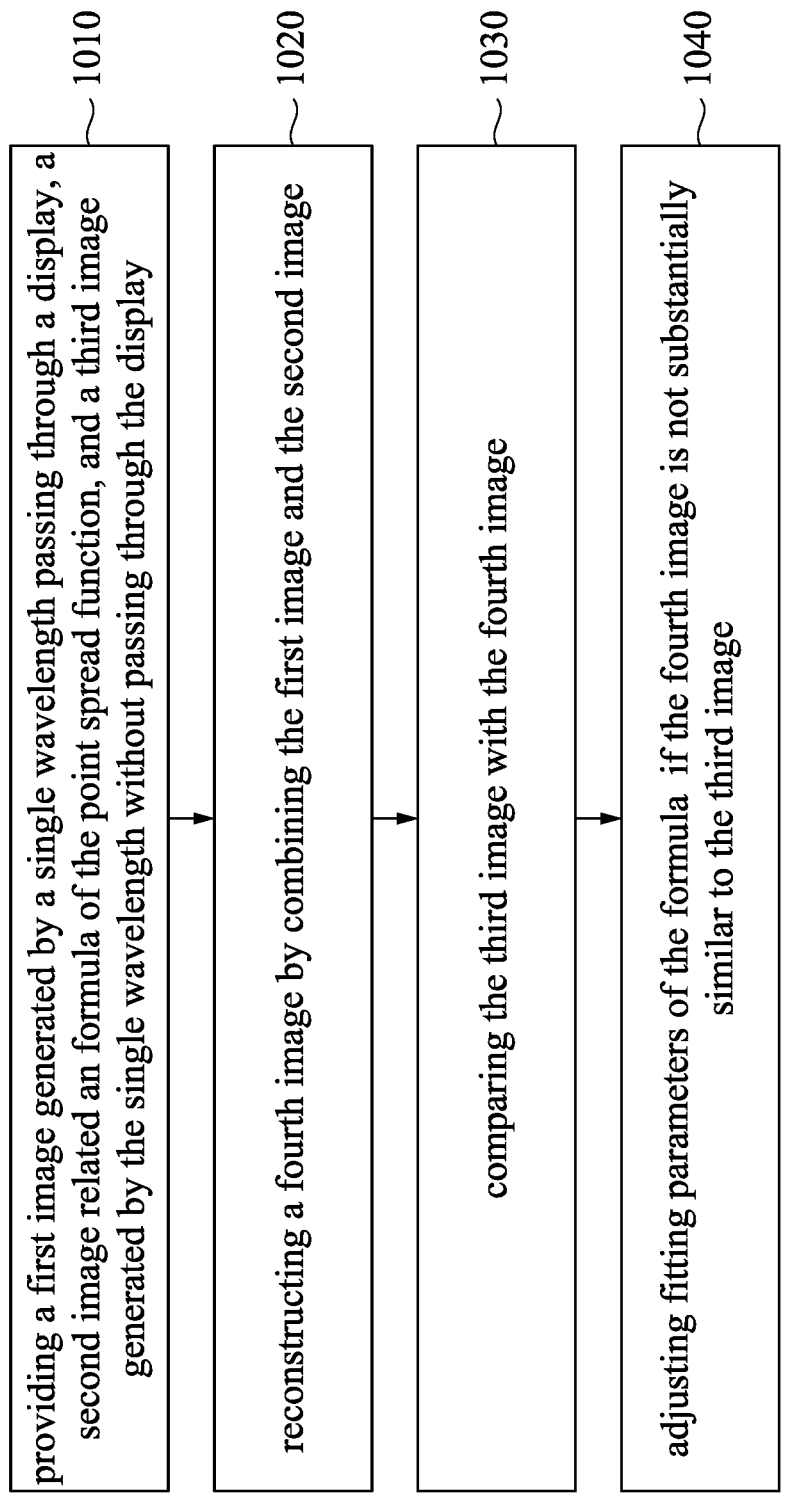
FIG. 10 illustrates a flow chart of a method of training a first model unit according to one embodiment of the present disclosure.

Referring to both FIG. 8 and FIG. 10, FIG. 10 illustrates a flow chart of a method of training the first model unit 300 according to one embodiment of the present disclosure. In some embodiments, reconstructing the edge information is performed by the first model unit 300. The method of training the first model unit 300 includes steps as outlined below. In step 1010, a first image generated by a single wavelength passing through a display, a second image related to a formula of the point spread function, and a third image generated by the single wavelength without passing through the display are provided. In step 1020, a fourth image is reconstructed by combining the first image and the second image. In step 1030, the third image is compared with the fourth image. In step 1040, fitting parameters of the formula are adjusted if the fourth image is not substantially similar to the third image. The first image combined with the second image may be viewed as an input of the first model unit 300, and the fourth image may be viewed as an output of the first model unit 300. The first model unit 300 may be able to learn how to reconstruct the fourth image by combining the first image with the second image and adjusting the fitting parameters of the formula if the fourth image is not substantially similar to the third image.

Figure 11:
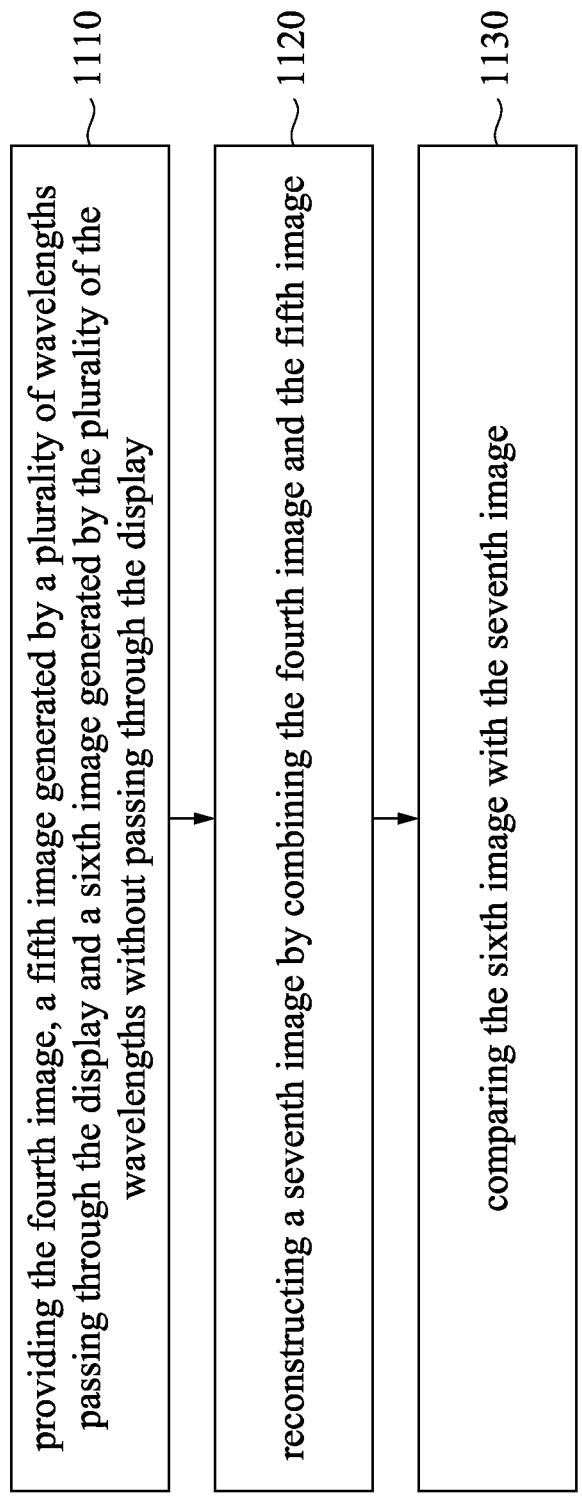
FIG. 11 illustrates a flow chart of a method of training a second model unit according to one embodiment of the present disclosure.

Referring to FIG. 2A, FIG. 8 and FIG. 11, FIG. 11 illustrates a flow chart of a method of training the second model unit 400 according to one embodiment of the present disclosure. In some embodiments, obtaining the image is performed by the second model unit 400. The method of training the second model unit 400 includes steps as outlined below. In step 1110, the fourth image, a fifth image generated by a plurality of wavelengths passing through the display and a sixth image generated by the plurality of the wavelengths without passing through the display are provided. In step 1120, a seventh image is reconstructed by combining the fourth image and the fifth image. In step 1130, the sixth image is compared with the seventh image. The second model unit 400 has different inputs and outputs from the first model unit 300. For example, the input of the first model unit 300 is one of plurality of the diffraction patterns provided by the database unit 200 and the first narrowband information provided by the plurality of the first narrowband filters 122, and an input of the second model unit 400 is the edge information provided by the first model unit 300 and the color information provided by the plurality of the color filters 124. The fifth image may include the color information and the fourth image may include the edge information. The second model unit 400 may be able to learn how to restore the image by combining the edge information with the color information to reconstruct the seventh image and comparing the sixth image with the seventh image.

In summary, the pixel array includes the plurality of first narrowband filters configured to generate the first narrowband information. The spectrum linewidth of the plurality of the first narrowband filters is in a range from 5 nm to 70 nm. The first model unit may reconstruct the edge information from the first narrowband information based on the one of the plurality of the diffraction patterns provided by the database unit of the point spread function. Moreover, the second model unit may combine the edge information with the color information provided by the plurality of the color filters to obtain an image. Since the combination of the first model unit, the plurality of the first narrowband filters and the database unit of the point spread function may resolve diffraction problems, an image with higher resolution is obtained. As a result, a performance of the under-display camera system is improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An under-display camera system, comprising:
a pixel array configured to provide a raw data, wherein the pixel array comprises:
a plurality of color filters disposed on a plurality of first photodiodes, respectively, and configured to generate a color information in accordance with the raw data; and
a plurality of first narrowband filters disposed on a plurality of second photodiodes, respectively, and configured to generate a first narrowband information in accordance with the raw data, wherein a first spectrum linewidth of the plurality of the first narrowband filters is in a range from 5 nm to 70 nm;
a database unit of a point spread function configured to store a plurality of diffraction patterns;
a first model unit receiving the first narrowband information from the pixel array and electrically connected to the database unit of the point spread function, wherein the first model unit is configured to reconstruct an edge information from the first narrowband information based on one of the plurality of the diffraction patterns provided by the database unit of the point spread function; and
a second model unit electrically connected to the first model unit and the pixel array, wherein the second model unit is configured to obtain an image by combining the edge information with the color information.

2. The under-display camera system of claim 1, wherein the plurality of the first narrowband filters correspond to a first single wavelength, and the first single wavelength is in a range from 400 nm to 1000 nm.

3. The under-display camera system of claim 1, wherein a spectrum linewidth of the plurality of the color filters is in a range from 150 nm to 200 nm.

4. The under-display camera system of claim 1, wherein an area ratio of the plurality of the first narrowband filters in the pixel array is in a range from 6.25% to 25%.

5. The under-display camera system of claim 1, wherein adjacent two of the plurality of the first narrowband filters are merged.

6. The under-display camera system of claim 1, wherein each of the plurality of the first narrowband filters comprises a first portion and a second portion disposed on the first portion.

7. The under-display camera system of claim 6, wherein the first portion corresponds to a first spectrum same as one of the plurality of the color filters, and the second portion corresponds to a second spectrum different from the first spectrum.

8. The under-display camera system of claim 1, wherein the plurality of the first narrowband filters are surrounded by the plurality of the color filters.

9. The under-display camera system of claim 1, wherein the pixel array further comprises:
a plurality of second narrowband filters configured to generate a second narrowband information in accordance with the raw data, wherein the first model unit further reconstructs the edge information from the second narrowband information based on another one of the plurality of the diffraction patterns.

10. The under-display camera system of claim 9, wherein a second spectrum linewidth of the plurality of the second narrowband filters is in a range from 5 nm to 70 nm and different from the first spectrum linewidth.

11. The under-display camera system of claim 9, wherein one of the plurality of the color filters is located between the plurality of the first narrowband filters and the plurality of the second narrowband filters.

12. The under-display camera system of claim 9, wherein the plurality of the second narrowband filters are adjacent to the plurality of the first narrowband filters, and the plurality of the second narrowband filters are surrounded by the plurality of the color filters.

13. The under-display camera system of claim 9, wherein an area ratio of the plurality of the first narrowband filters in the pixel array is the same as an area ratio of the plurality of the second narrowband filters in the pixel array.

14. An operating method of an under-display camera system, comprising:
providing a raw data by a pixel array;
generating, by a plurality of color filters respectively disposed on a plurality of first photodiodes of the pixel array, a color information in accordance with the raw data;
generating, by a plurality of first narrowband filters respectively disposed on a plurality of second photodiodes of the pixel array, a first narrowband information in accordance with the raw data, wherein a spectrum linewidth of the plurality of first narrowband filters is in a range from 5 nm to 70 nm;
reconstructing an edge information from the first narrowband information based on one of a plurality of diffraction patterns provided by a database unit of a point spread function; and
obtaining an image by combining the edge information with the color information.

15. The method of claim 14, wherein the plurality of the first narrowband filters correspond to a wavelength same as the one of the plurality of the diffraction patterns.

16. The method of claim 14, further comprising:
generating, by a plurality of second narrowband filters of the pixel array, a second narrowband information in accordance with the raw data.

17. The method of claim 16, wherein reconstructing the edge information further comprises reconstructing the edge information from the second narrowband information based on another one of the plurality of the diffraction patterns.

18. The method of claim 14, wherein the database unit of the point spread function is built by:
tagging each of the plurality of the diffraction patterns generated by a plurality of single wavelengths, respectively, passing through a display; and
storing the plurality of the diffraction patterns.

19. The method of claim 14, wherein reconstructing the edge information is performed by a first model unit, and the first model unit is trained by:
providing a first image generated by a single wavelength passing through a display, a second image related a formula of the point spread function, and a third image generated by the single wavelength without passing through the display;
reconstructing a fourth image by combining the first image and the second image;
comparing the third image with the fourth image; and
adjusting fitting parameters of the formula if the fourth image is not substantially similar to the third image.

20. The method of claim 19, wherein obtaining the image is performed by a second model unit, and the second model unit is trained by:

providing the fourth image, a fifth image generated by a plurality of wavelengths passing through the display and a sixth image generated by the plurality of the wavelengths without passing through the display;
reconstructing a seventh image by combining the fourth image and the fifth image; and
comparing the sixth image with the seventh image.

* * * * *